(12) United States Patent
Gogoi et al.

(10) Patent No.: US 6,744,264 B2
(45) Date of Patent: Jun. 1, 2004

(54) TESTING CIRCUIT AND METHOD FOR MEMS SENSOR PACKAGED WITH AN INTEGRATED CIRCUIT

(75) Inventors: Bishnu P. Gogoi, Scottsdale, AZ (US); Sung Jin Jo, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 3 days.

(21) Appl. No.: 10/133,701

(22) Filed: Apr. 25, 2002

(65) Prior Publication Data

US 2003/0201777 A1 Oct. 30, 2003

(51) Int. Cl.$^7$ .............................................. G01R 27/26
(52) U.S. Cl. ..................... 324/658; 324/661; 73/514.18; 73/862.626; 73/862.61
(58) Field of Search ................................. 324/658, 661, 324/663, 665, 666, 676, 680, 686; 73/514.18, 862.626, 862.61, 718, 724, 754; 361/280, 283.3

(56) References Cited

U.S. PATENT DOCUMENTS

| | | | | |
|---|---|---|---|---|
| 5,325,065 A | * | 6/1994 | Bennett et al. ............. | 324/661 |
| 5,345,824 A | | 9/1994 | Sherman et al. ......... | 73/514.18 |
| 5,465,604 A | | 11/1995 | Sherman ..................... | 73/1.38 |
| 5,503,016 A | | 4/1996 | Koen ........................... | 73/493 |
| 5,540,095 A | | 7/1996 | Sherman et al. ......... | 73/514.18 |
| 5,612,494 A | * | 3/1997 | Shibano ................... | 73/514.32 |
| 5,616,863 A | | 4/1997 | Koen ........................... | 73/493 |

OTHER PUBLICATIONS

S. J. Sherman et al., "A Low Cost Monolithic Accelerometer; Product/Technology Update", Analog Devices, Inc. Wilmington, MA, IEEE 1992, 0–7803–0817–4/92, pp. 19.1.1–19.1.4.

Henry V. Allen et al., "Self–Testable Accelerometer Systems", IC Sensors, Milpitas, CA, 1989 IEEE, TH0249–3/89/0000/0024, pp. 113–115.

Farzad Purahmadi et al., "Silicon Accelerometer With New Thermal Self–Test Mechanism", Lucas NovaSensor, Fremont, CA 94539, 1992 IEEE, 0–7803–0456–X/92, pp. 122–125, no month available.

Leland Chip Spangler et al., "Isaac—Integrated Silicon Automotive Accelerometer", Ford Microelectronics, Inc., Colorado Springs, CO, The 8$^{th}$ International Conference on Solid–State Sensors and Actuators, and Eurosensors IX, Stockholm, Sweden, Jun. 25–29, 1995, pp. 585–588.

Thomas Tschan et al., "A High–Performance, Low Cost Capacitive Accelerometer Trimmed Using Nonvolatile Potentiometers (EEPOT's)", Silicon Microstructures Inc. Fremont, CA, The 8$^{th}$ International Conference on Solid–State Sensors and Actuators, and Eurosensors IX, Stockholm, Sweden, Jun. 25–29, 1995, pp. 601–603.

* cited by examiner

Primary Examiner—N. Le
Assistant Examiner—Vincent Q. Nguyen

(57) ABSTRACT

A MEMS sensor packaged with an integrated circuit includes switches and control circuitry. In a test mode, the control circuitry causes the switches to turn off and on such that the first and second capacitance of the MEMS sensor can be monitored individually. During a normal mode of operation, the switches are maintained such that the MEMS sensor packaged with the integrated circuit operates to produce a filtered and trimmed output reflecting the sensed phenomena.

15 Claims, 3 Drawing Sheets

TESTING CIRCUIT AND METHOD FOR MEMS SENSOR PACKAGED WITH AN INTEGRATED CIRCUIT

FIELD OF THE INVENTION

This invention relates to MEMS circuits and, more specifically, to a method and circuit for testing the characteristics of the individual capacitances of a MEMS sensor that has been sealed or packaged that may be integrated with another circuit or packaged with another circuit.

BACKGROUND OF THE INVENTION

One prior art model of a MEMS sensor integrated with a circuit is shown in FIG. 1. The MEMS sensor 100 is represented by a first capacitor 110 and a second capacitor 120 sharing a common node 130a that represents a moving element. When an excitation voltage is applied to the plates 110a and 120a of a MEMS sensor and fluctuations occur on the moving element 130a due to an input stimulus like acceleration or pressure, the moving element changes its position according to the input stimulus. When this occurs, capacitances between 110 and 120 change. The output 130 of the moving element of the MEMS sensor 100 is fed into a first amplifier input 141 of a capacitor-voltage (C-V) converter 143. The other input to the amplifier is connected to a reference voltage 142. During a reset, the reference voltage is also applied to the two plates 181 and 182 of the MEMS sensor 100. The reference voltage 142 can be hardwired to the sensor and amplifier directly through the pins of the package or can be controlled by an on-chip control 150, such as an ASIC or other control logic. In either case, after the packaged MEMS sensor and IC have been reset by switch 192, the voltage applied to the plates of the sensor is excited by changing the voltage directly applied to the pins of the package or by programming the control logic to switch between various voltages supplied to the package. The excitation voltage applied to plates 181 and 182 start at the voltage reference after reset and then are excited to an excitation voltage that is equal in magnitude and opposite in polarity. For instance, the voltage applied to the first plate 181 would step from the voltage reference to an excitation voltage (Vexcite) at the same time that the voltage applied to the second plate 182 steps from the reference voltage Vref to a negative excitation voltage (−Vexcite). Each step function would then alternate to its original reference voltage state and back again so that any fluctuations on the moving element 130a would cause corresponding fluctuations on the capacitors 110 and 120.

The amplifier 140 produces a C-V output voltage 155 reflecting the difference between the first and second capacitances 110 and 120 experienced by fluctuations in the moving member caused by the input stimulus. The C-V output voltage 155 is typically modified by a feedback capacitance Cref represented by feedback path 145 (and reset by switch 192) such as to produce an output voltage Vout=−[(C1−C2)/Cref]*(Vexcite−Vref). The C-V output voltage 155 is then signal conditioned as needed by other integrated circuitry 160, such as filters, gain and offset trim and the like. The final output voltage 170 of the integrated device represents the physical activity of the MEMS sensor and is used in various applications such as accelerometers, pressure sensors, gyroscopes.

To reduce failure rates, the MEMS sensors are tested before being packaged. However, before and during packaging with the circuit, additional processing problems cause some MEMS sensors to malfunction or become damaged. Some problems may occur due to moisture ingress into the capacitor, for example. Common MEMS problems involve stiction where the moving element 130a or proof mass comes into contact with the fixed plates 181, 182. Additionally, breakages or holes may occur in the moving element. Because the MEMS sensor's moving element is extremely delicate, often resulting in capacitance changes in the few femto-farad range, direct connections to sensor elements such as the moving element are problematic as any probing would make the measurements inaccurate. Additionally, once the circuit and sensor are packaged, the only measurement available always reflects the difference between both sensor capacitances and does not assist in identifying problems with the individual capacitances.

Accordingly, what is needed is a packaged sensor device that allows for more accurate testing of the MEMS sensor after it has been packaged with an IC.

DETAILED DESCRIPTION OF THE PREFERRED EMBODIMENT

Figure 1:
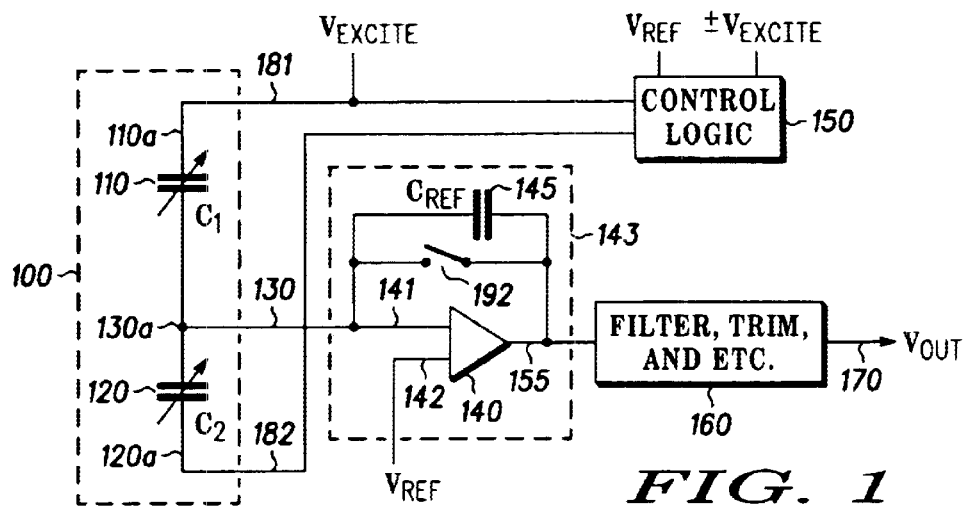
FIG. 1 is a simplified electrical schematic of a prior art MEMS sensor integrated with an IC circuit.
Figure 2:
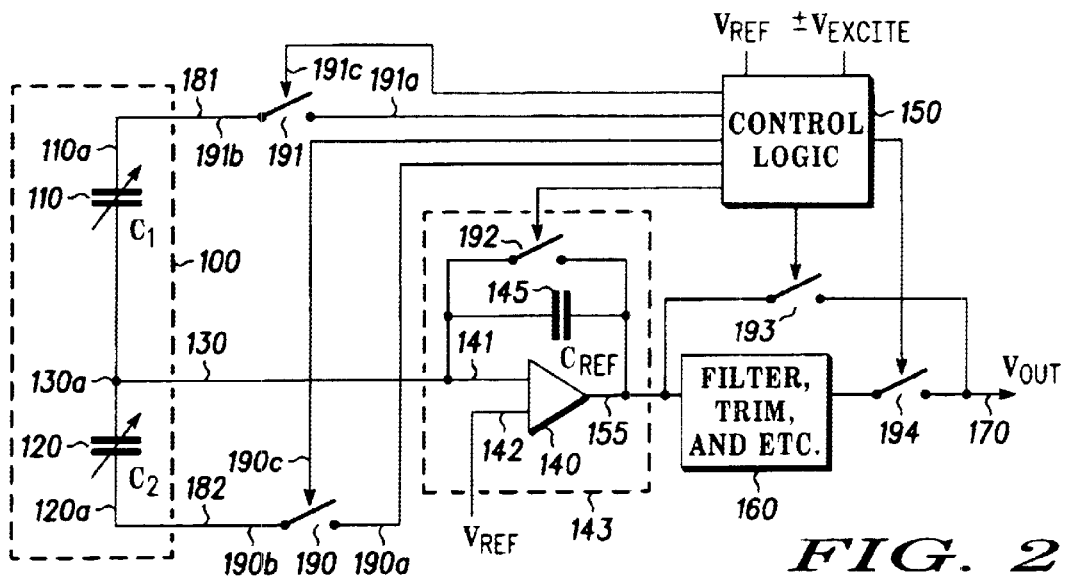
FIG. 2 is a simplified electrical schematic of one embodiment of a MEMS sensor integrated with an IC circuit that includes testing circuitry.

Referring to FIG. 2, one model of an embodiment of a MEMS sensor 100 packaged with a circuit that includes testing circuitry is shown. For simplicity, similar reference numerals are used throughout the figures to represent similar features when possible.

The MEMS sensor 100 is represented by a first capacitor 110 and a second capacitor 120 such that when an excitation voltage is applied to the plates 181, 182 of a MEMS sensor and fluctuations occur on the moving element 130a, a difference in the capacitances C1 110 and C2 120 may be observed. The output 130 of the moving element 130a of the MEMS sensor 100 is fed into a first input 141 of an amplifier 140 of C-V converter 143. The other input 142 to the amplifier 140 is connected to a reference voltage Vref that is also typically applied to the first and second plates 181 and 182 of the MEMS sensor 100 during a reset stage. Switches 190 and 191 allow for blocking a voltage being applied to any combination of the plates of the sensor 181 and 182. Switches 190 and 191 may be any electrical device that can operate in two states, one allowing current to flow and the other state preventing current from flowing across its terminals 190a to 190b and 191a to 191b. For instance, the switch could be a CMOS transistor with gates 190c/191c, sources 190a/191a and drains 190b/191b. When the voltage applied to the gate reaches a point where the Voltage exceeds a known threshold the switch turns "ON" and allows the current to flow from the source to the drain. The nomenclature allows the switch to be "ON" in the sense that the transistor has been activated, but from the model of a switch 191 and 190, it is also acceptable to consider the switch "CLOSED" when the transistor is "ON." Accordingly, this nomenclature will be used throughout the description. It should be made clear that other nomenclatures could be adopted and are within the scope of the invention. In addition, other types of transistors or switches may be used that accomplish a similar electrical phenomena and any reference to a switch made in this description is likewise defined.

The voltage applied to input 142 of the amplifier 140 and to the source sides of the switch 190a and 191a may be hardwired to a pin on the package that may be manipulated on a testing bench or the package can have pins for multiple voltages as shown in FIG. 2. In this case, the reference voltage 142 and another excitation voltage is hardwired to the circuit and is manipulated by a control logic, such as an ASIC for applying the various voltages to the switches 190 and 191 as well as the input of the amplifier 142. The design may have more than two voltages coming into the control logic if needed and may apply varying voltages to the sources of the switches 190 and 191 such that the voltage appearing on source 191a could be different that that appearing on 190a and 142 for instance. Any combination of applied voltages is within the scope of the invention.

Therefore, the reference voltage Vref and the excitation voltage Vexcite can be hardwired to the sources of the switches and/or amplifier directly through the pins of the package or can be controlled by an on-chip control 150, such as an ASIC or other control logic. ASIC designs and other control logic are well known in the electrical arts for controlling when and what duration to turn on switches and apply various voltages and accordingly is not discussed in detail.

The voltage applied to the amplifier and the plates of the sources of the switches can be altered by changing the voltage directly applied to the pins of the package or by programming the control logic to switch between various voltages supplied to the package. During normal operation, the amplifier 140 produces an C-V output voltage 155 reflecting the difference between the first capacitor C1 and second capacitor C2 experienced by fluctuations in the sensor's moving element. This output 155 is typically modified by a feedback capacitance Cref represented by feedback path 145 such as to produce an output voltage C-Vout=−[(C1−C2)/Cref]*(Vexcite−Vref). Another switch 192 provides for discharging the reference capacitance 145 when necessary for testing or resetting by closing the switch 192.

The C-V output voltage 155 is then adjusted as needed by other integrated circuitry 160, such as filters and trimmers. Another switch 193 in combination with switch 194 allows the additional integrated circuitry 160 to be bypassed when the switch 193 is closed and the switch 194 is opened allowing the final output voltage 170 to be the C-V output voltage of the amplifier appearing at 155. During normal operation, the output voltage 170 of the integrated device represents the physical activity of the MEMS sensor and is used in various applications such as accelerometers, pressure sensors and gyroscopes.

During normal operation, switches 190, 191 and 194 are closed or "ON", switch 193 is open or "OFF", and switch 192 is alternately "on" and "off" during operation as needed. This allows the circuit to perform like traditional MEMS sensors packaged with an integrated circuit where the voltage appearing at 155 reflects the total action of the sensor's moving element by measuring the difference of the representative capacitances, such that C-Vout=−[(C1−C2)/Cref]*(Vexcite−Vref) and the voltage appearing at 170 is the C-V output voltage modified by any circuitry in 160 such as filters or trimmers.

Figure 3:
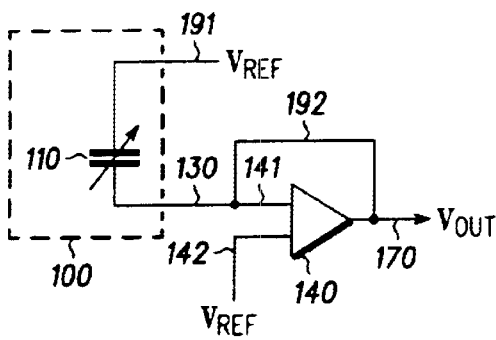
FIGS. 3–5 are a series of simplified schematics during various timing cycles of testing the Sensor's first capacitance.
Figure 4:
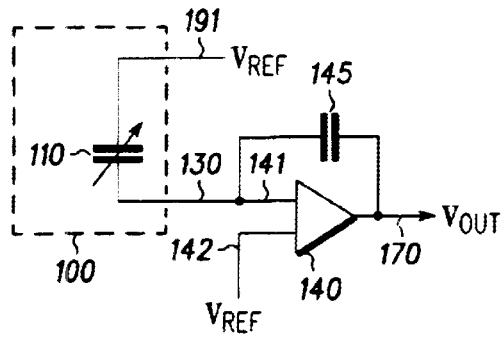
Figure 5:
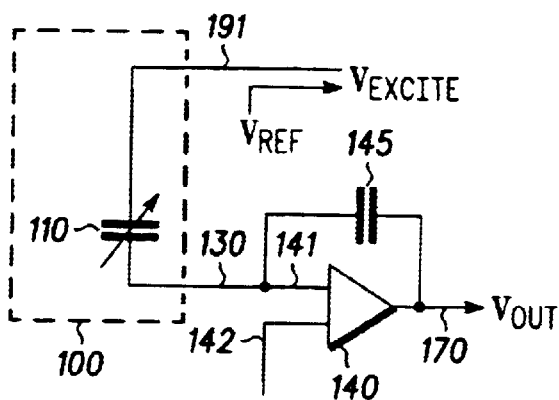

FIGS. 3–5 are embodiments of the same circuit during various timing sequences of a test operation where the first capacitance C1 of the sensor is being tested. In FIG. 3, the control circuitry in a first instance opens switch 190 and 194 while closing switches 191, 192 and 193. The reference voltage is applied to both switches 190 and 191 as well as to the amplifier 140 through input 142. However, as the switch is opened leading to the plate of second capacitor C2, no voltage actually gets applied to C2. During the first instance shown in FIG. 3, the reference capacitance Cref 145 is discharged when switch 192 is closed.

In a second instance, switch 192 is opened resulting in the circuit shown in Figure. And, in a final instance, the reference voltage applied to switch 191 is stepped to a known excitation voltage Vexcite as shown in FIG. 5. The switching of voltages allows the first capacitance C1 of the sensor to be evaluated as the output voltage appearing at 155 and 170 (because switch 193 is closed and switch 194 is opened)=−[C1/Cref]*(Vexcite−Vref). The circuit can then be switched between the circuits shown in FIGS. 3–5 as needed.

Figure 6:
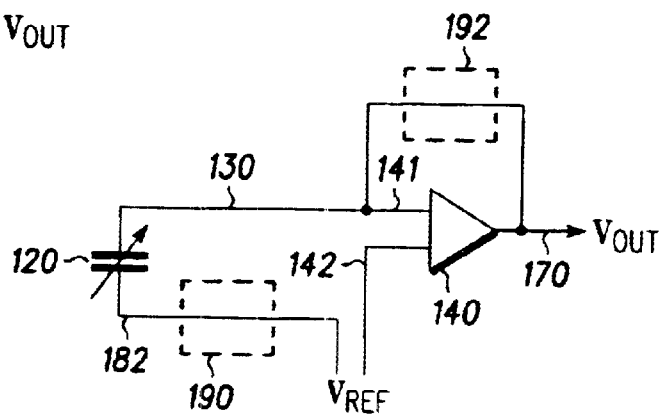
FIGS. 6–8 are a series of simplified schematics during various timing cycles of testing the Sensor's second capacitance.
Figure 7:
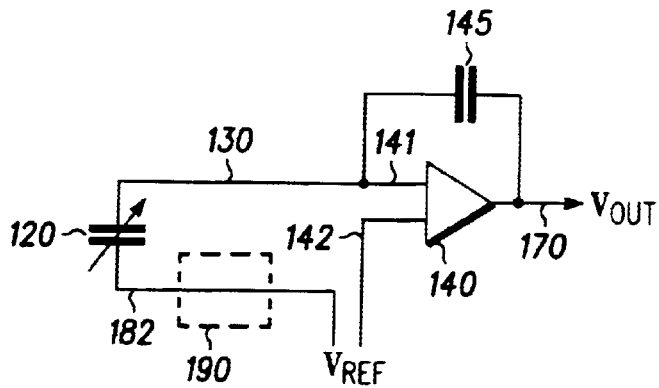
Figure 8:
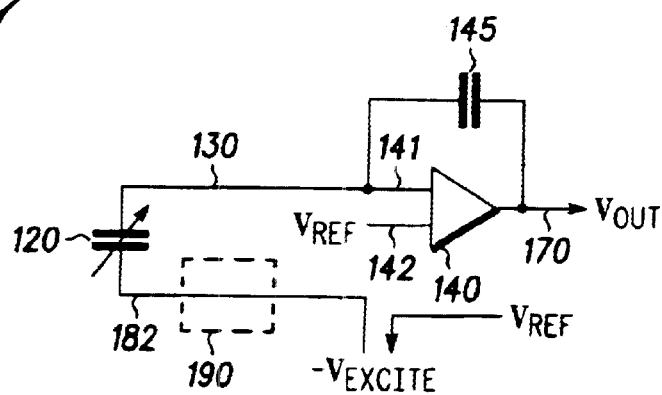

Similarly, a cycle of switching can be programmed for testing the second capacitance C2 of the sensor as shown in FIGS. 6–8. FIGS. 6–8 are embodiments of the same circuit during various timing sequences of a test operation where the second capacitance C2 of the sensor is being tested. In FIG. 6, the control circuitry in a first instance opens switch 191 and 194 while closing switches 190, 192 and 193. The reference voltage is still supplied to the switch 190 and to the amplifier 140. During the first instance shown in FIG. 6, the capacitance Cref is discharged by closing switch 192.

In a second instance, switch 192 is opened resulting in the circuit shown in FIG. 7. And, in a final instance, the reference voltage applied to switch 190 is switched to a known excitation voltage −Vexcite as shown in FIG. 8. The application of the excitation voltage allows the second capacitance of the sensor to be evaluated as the output voltage appearing at 155 and 170 (because switch 193 is closed)=[C2/Cref]*(Vexcite−Vref). The circuit can then be switched between the circuits shown in FIGS. 6–8 as needed.

Figure 9:
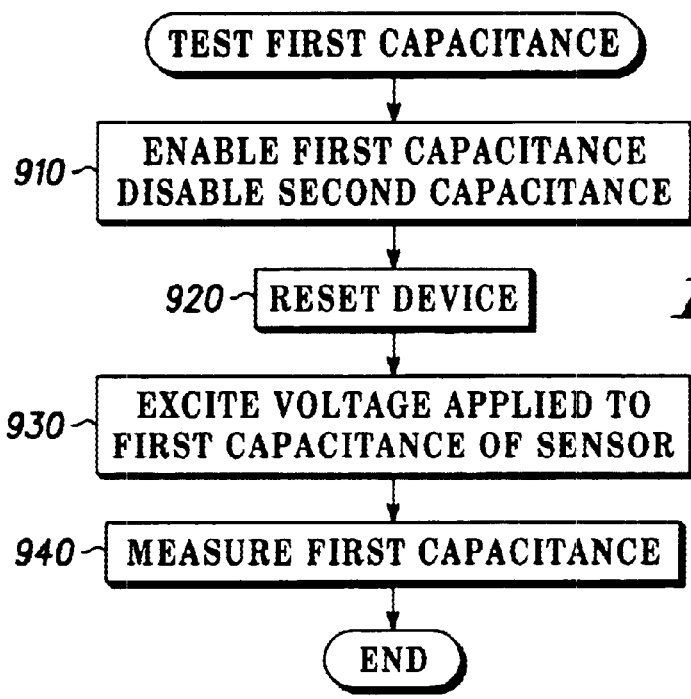
FIGS. 9–10 are flow charts demonstrating the steps required for testing the various capacitances of a MEMS sensor packaged with an IC.

FIG. 9 is a flow chart showing how the various capacitances are monitored on the sealed MEMS sensor integrated with a circuit. In step 910, the first capacitance C1 is enabled while the second capacitance C2 is disabled by opening switch 190 for disabling power to the second capacitance. In step 920, the MEMS sensor packaged with the IC is reset by discharging the reference capacitance Cref of the amplifier. In step 930, the voltage applied to the first capacitor is excited at the plate 181 of the sensor. This allows the individual capacitance C1 to be observed in step 940 as C-Vout 155 equals the ratio—C1/Cref(Vexcite−Vref).

Figure 10:
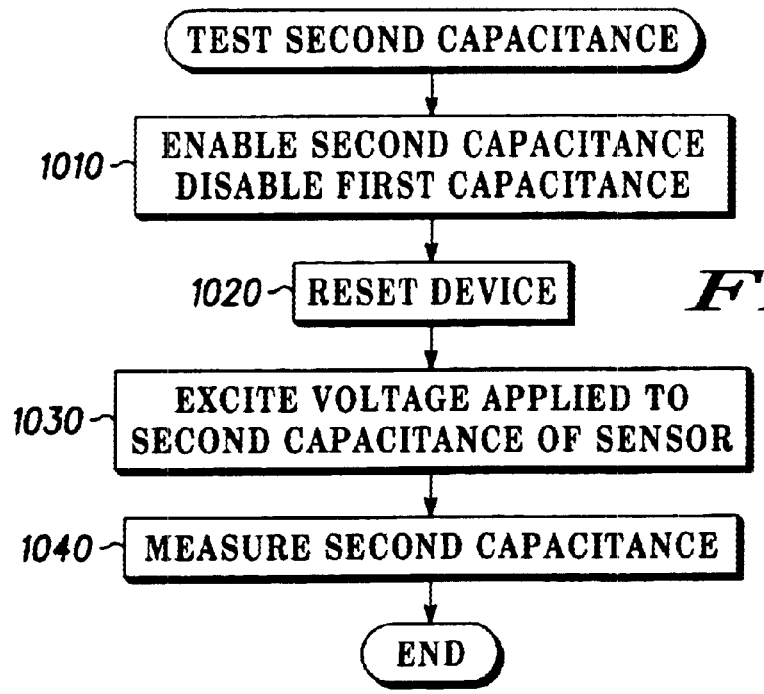

Similarly, FIG. 10 is a flow chart showing how the second capacitance is monitored. In step 1010, the second capacitance is enabled while the first capacitance is disabled for testing by disabling the power to the first capacitance (turning switch 191 off). In step 1020, the MEMS sensor packaged with an IC is reset by discharging the amplifier's feedback capacitance Cref. In step 1030, the voltage applied to the second capacitor is excited at the plate 182 of the sensor. This allows the individual capacitance C2 to be observed in step 1040 as C-Vout 155 equals the ratio [C2/Cref](Vexcite−Vref).

Once the testing cycle has been initiated by discharging the reference capacitance Cref 145, the excitation voltage applied may be a step function with the reference capacitance Cref 145 intermittently reset so the individual capacitances can be monitored while other environmental conditions are adjusted, such as temperature. By isolating the various capacitances of the sensor a more accurate understanding of a defect can take place such that processes can be improved and failing devices better identified reducing defective parts shipped to customers.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A packaged device comprising:
    a micro-electromechanical systems (MEMS) sensor comprising a moving element connected to a first output, a first plate connected to a second output and a second plate connected to a third output, wherein the moving element and the first plate form a first capacitor producing a first capacitance and the moving element and the second plate form a second capacitor producing a second capacitance;
    an amplifier with a first input connected to the first output, a second input connected to a first voltage of a plurality of voltages and a fourth output accessible outside the integrated circuit;
    a testing means for causing an output voltage appearing at the fourth output to reflect one of the first and the second capacitances, wherein the testing means comprises a first switch preventing any voltage from being applied to the second output in an open state.

2. The packaged device of claim 1 further comprising a reference capacitor connected between the first input and the fourth output.

3. The packaged device of claim 1 wherein the testing means further comprises a second switch preventing any voltage from being applied to the third output in an open state.

4. The packaged device of claim 3 further comprising a third switch for discharging the reference capacitor in a closed state.

5. The packaged device of claim 4, wherein the testing means comprises a control logic for determining in what sequence to discharge the reference capacitor by closing the third switch, open the first switch and step the first voltage applied to the third output to a second voltage of the plurality of voltages.

6. The packaged device of claim 1 further comprising a control logic means for applying one of the plurality of voltages.

7. The packaged device of claim 4, further comprising a signal conditioning circuitry connected to the fourth output and producing a fifth output with a conditioned signal.

8. The packaged device of claim 4 further comprising a means for applying the plurality of voltages, the means for applying the plurality of voltages including a control logic for sequentially doing one of either opening the first switch while keeping the second switch closed and toggling the voltage applied to the third output from the first voltage to a second voltage of the plurality of voltages or opening the second switch while keeping the first switch closed and toggling the voltage applied to the second output from the first voltage to a third voltage of the plurality of voltages.

9. The packaged device of claim 7 further comprising a fourth switch and a fifth switch allowing the fourth output to bypass the signal conditioning circuitry when the fourth switch is in a closed state and the fifth switch is in an open state.

10. The packaged device of claim 9 wherein the testing means includes a control logic for sequentially doing one of either opening the first switch while keeping the second switch closed and toggling the voltage applied to the third output from the first voltage to a second voltage of the plurality of voltages or opening the second switch while keeping the first switch closed and toggling the voltage applied to the second output from the first voltage to a third voltage of the plurality of voltages.

11. The packaged device of claim 10 wherein the testing means further includes control logic for causing the fourth output to appear at the fifth output by bypassing the signal conditioning circuitry.

12. A packaged device comprising:
    a micro-electromechanical systems (MEMS) sensor comprising a moving element connected to a first output, a first plate connected to a second output and a second plate connected to a third output, wherein the moving element and the first plate form a first capacitor producing a first capacitance and the moving element and the second plate form a second capacitor producing a second capacitance;
    an amplifier with a first input connected to the first output, a second input connected to a first voltage of a plurality of voltages and a fourth output accessible outside the integrated circuit;
    a reference capacitor connected between the first input and the fourth output;
    a control logic providing a plurality of control signals;
    a first switch connected between the second output and the control logic, wherein the switch is enabled or disabled by a first control signal of the plurality of control signals;
    a second switch connected between the third output and the control logic, wherein the second switch is enabled or disabled by a second control signal of the plurality of control signals; and
    a third switch connected between the first input and the fourth output, wherein the third switch is enabled or disabled by a third control signal of the plurality of control signals.

13. The packaged device of claim 12 further comprising a signal conditioning circuitry having a fifth output connected between the fourth output and an output pin.

14. The packaged device of claim 13 further comprising a fourth switch connected between the fourth output and the output pin and a fifth switch connected between the fifth output and the output pin, wherein the fourth switch and the fifth switch are enabled by a fourth control signal and a fifth control signal, respectively.

15. A method for testing individual characteristics of a first capacitance and a second capacitance of a micro-electromechanical systems (MEMS) sensor packaged with an integrated circuit comprising:
    disabling one of either the first capacitance and the second capacitance;
    causing a common node of the first and second capacitance to appear on a first input of an amplifier;
    causing a reference voltage to appear on a second input of the amplifier;
    discharging a reference capacitor connected between the first input and an output of the amplifier;
    after discharging the reference capacitor causing a voltage applied to the other of either the first capacitance and the second capacitance to change from the reference voltage to an excitation voltage;
    measuring a characteristic representative of the other of either the first capacitance and the second capacitance appearing on the output; and
    intermittently discharging the reference capacitor and causing the voltage applied to the other of the first capacitance and second capacitance to step between the reference voltage and the excitation voltage.

* * * * *